United States Patent [19]
Paige

[11] 3,978,437
[45] Aug. 31, 1976

[54] SURFACE ACOUSTIC WAVE DEVICES

[75] Inventor: Edward George Sydney Paige, West Malvern, England

[73] Assignee: British Secretary of State for Defence, London, England

[22] Filed: June 27, 1975

[21] Appl. No.: 590,908

[30] Foreign Application Priority Data
July 2, 1974 United Kingdom............... 29284/74

[52] U.S. Cl. .................................. 333/72; 310/8.1; 310/9.8; 333/30 R
[51] Int. Cl.² ...................... H03H 9/26; H03H 9/30
[58] Field of Search................ 333/30 R, 72, 71, 76; 310/8, 8.1, 8.2, 9.8

[56] References Cited
UNITED STATES PATENTS

| | | | |
|---|---|---|---|
| 3,568,102 | 3/1971 | Tseng............................... | 333/30 R |
| 3,680,007 | 7/1972 | Tseng............................... | 310/9.8 X |
| 3,727,718 | 4/1973 | Whitehouse...................... | 333/30 X |
| 3,873,946 | 3/1975 | Weglien........................... | 333/72 X |
| 3,883,831 | 5/1975 | Williamson et al.............. | 310/8.1 X |

Primary Examiner—Alfred E. Smith
Assistant Examiner—E. R. LaRoche
Attorney, Agent, or Firm—Pollock, VandeSande & Priddy

[57] ABSTRACT

A surface acoustic wave device comprises a piezoelectric substrate which carries input and output transducers for launching and receiving surface acoustic waves on the substrate, one or more reflective arrays for reflecting surface acoustic waves between the two transducers, wherein at least one array comprises numerous spaced reflecting elements of varying lengths arranged in two sets, one set being angled to reflect surface acoustic wave in one direction while the other set is angled to reflect surface acoustic wave in another direction. Varying the lengths of the reflecting elements provides weighting of signals passing through the device. Additionally pulse compression and expansion may be arranged with or without frequency dispersion.

11 Claims, 7 Drawing Figures

SURFACE ACOUSTIC WAVE DEVICES

This invention relates to surface acoustic wave (SAW) devices.

Such devices may comprise a piezo electric substrate with input and output interdigital transducers mounted on a flat surface of the substrate. Application of an electric signal to the input transducer causes SAW to be launched in the substrate from where it is received as an electrical signal by the output transducer. Thus the transducers provide the function of transducing between electrical and acoustic energy. In addition they are often required to provide an operation on the acoustic energy when the devices are used as filters etc., such an operation may be amplitude and frequency weighting. Transducers are designed to provide this weighting operation by variation in finger length and finger spacing within the transducer. Unfortunately this weighting involves compromising the transducers function of transducing. Therefore separation of the weighting and transducing functions is desirable for some devices. One way of doing this is to use a reflective array structure (RAST) arranged between the input and output transducers. The RAST may then perform the weighting function whilst the transducers provide the transducing function.

A RAST may be produced by depositing numerous conducting reflective strips across a SAW track to reflect SAW from one track into another track. Unfortunately such a structure does not provide a weighting function since varying the strip length and hence reflection strength introduces undesirable refraction effects. Amplitude weighting by varying the thickness, i.e. mass, of the strips is unsuitable because of complexity and non-reproducibility.

Alternatively a RAST may be produced by forming a series of reflecting grooves in the substrate by an etchant or ion beam cutting.

A SAW device can be constructed to expand a pulse i.e. the output pulse is many times longer than the input pulse. Similarly a pulse may be compressed, i.e. its output pulse is many times shorter than the input pulse. A usual feature of such a pulse expander or compressor is that the delay time for transit between input and output transducer is dependent on the frequency of the signal. Such pulse expander or compressors are commonly used in "pulse compression" radars. One form of pulse expander or compressor is the RAST expander or compressor.

In a known device two series of grooves are cut in the surface of the substrate and are angled so that the first set reflects the SAW launched by the input transducer through 90° and the second series reflects the SAW through a further 90° into the output transducer. The frequency of the wave reflected is determined by the separation between the grooves. Thus by varying the separation between grooves the path length (and hence delay time) has the desired dependence on frequency. Amplitude weighting of the frequency response — necessary for compensating diffraction, external circuit factors, for suppressing sidelobes etc. — is achieved by making grooves of varying depths. One way of cutting these variable depth grooves is with an ion beam.

This method of construction of a RAST is both time consuming and is prone to non-reproducibility since the weighting must be individually built into each device.

According to this invention a surface acoustic wave device comprises a substrate able to support surface acoustic waves, a transducer for launching surface acoustic waves in a track on the substrate, a transducer for receiving surface acoustic waves from a track on the substrate, the substrate having piezo-electric regions at least at the transducers, and a first reflective array structure having two sets of varying length reflecting strips or grooves arranged across a surface acoustic wave track, one set angled to reflect some of the surface acoustic waves in the track into one direction and the other set angled to reflect some of the surface acoustic waves in the track into another direction.

The device may further comprise a second reflective array structure having reflecting strips or grooves for reflecting surface acoustic waves received from the first array into one of the transducers.

The surface acoustic waves reflected in the second direction may be absorbed by an absorber or further reflected into a further output transducer.

The substrate may be a piezo electric material. The reflecting strips or grooves (i.e. reflecting elements) may be equally spaced apart or of varying spacing.

According to an aspect of this invention a signal pulse is expanded or compressed by a surface acoustic wave device in which SAW launched on a piezo-electric substrate by an input transducer are reflected by a first and a second reflective array, both comprising several reflecting strips or grooves, and received by an output transducer, wherein at least the first array has two sets of reflecting strips or grooves one set angled to reflect SAW into the second array and the other set angled to reflect surface acoustic waves away from the second array, and wherein the length of the strips or grooves varies along the length of the first array whereby the output from the device is amplitude weighted.

The first or the second array may be arranged on the substrate to receive SAW direct from the input transducer. In an embodiment using only one reflective array the array receives SAW direct from an input transducer and reflects them direct into an output transducer.

The substrate may be lithium niobate or quartz whilst the transducers and arrays may be of aluminum evaporated onto the substrate using conventional photolithographic techniques. Alternatively, the array may be formed by grooves in the surface but now all of equal depth.

The lengths of reflecting strips in the first array may be varied as desired to produce the required weighting of output. Small breaks in the strips do not substantially affect operation of the device. Errors in the device amplitude response may be corrected by appropriate adjustment to the lengths of strips in the arrays.

The two arrays may be produced from a single large scale mask (artwork) and the weighting adjusted at the design stage to produce the desired final chrome mask.

The invention will now be described by way of example only with reference to the accompanying drawings in which.

Figure 1:
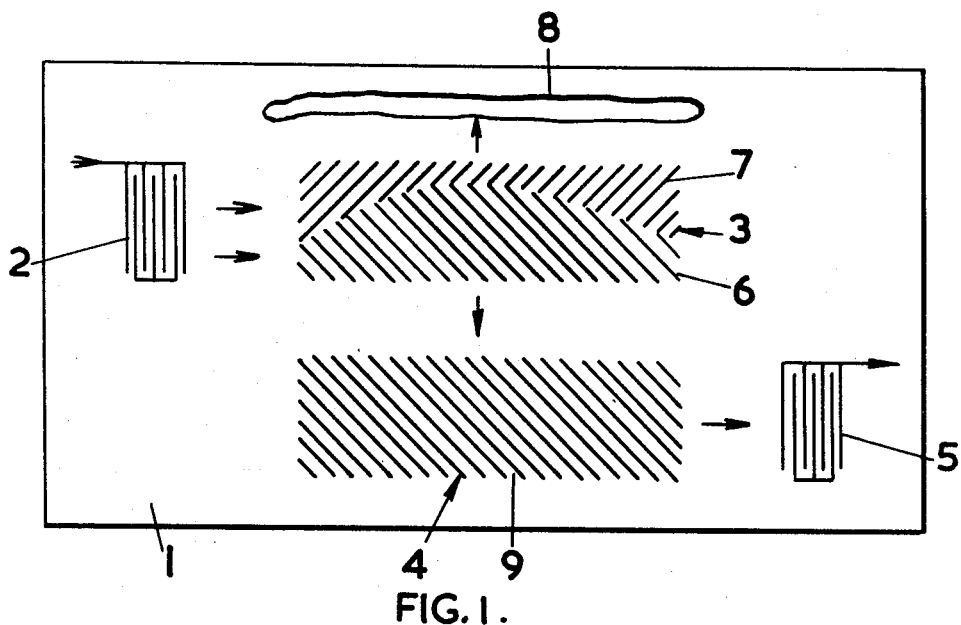
FIG. 1 shows a simple SAW device having an amplitude weighted output.

FIG. 1 shows a reflective array structure with a piezo electric substrate 1 such as lithium niobate, carrying on a flat surface an input transducer 2 arranged to emit surface acoustic waves into a first reflective array 3 where the surface acoustic waves are reflected into second reflective array 4 which again reflects the SAW into an output transducer 5.

The input 2 and output 5 transducers are conventional interdigital comblike transducers. The first array 3 has two sets of equally spaced conducting metal strips of primary 6 and a secondary 7 set; the primary set 6 is spaced parallel to one another and angled to reflect SAW into the second array 4 whilst the secondary set 7 is angled to reflect SAW into an absorber 8. The length of the strips 6, 7 determines the strength of reflections and so by varying the strip length along the array 3 the output signal of the device is amplitude weighted. However, in the absence of the secondary set 7 of reflecting strips, varying the strip length in the primary set 6 in the manner illustrated produces a lense effect by distorting the wave front of SAW and results in unacceptable distortion of signals. This problem is countered by the strips in the secondary set 7 which allows arrangement with respect to set 6 in which the SAW velocity is the same in both sets. The second reflecting array 4 also has reflecting strips 9 spaced in an identical manner to those in the primary set 6 in the first array 3 but of uniform length. Typically a reflecting array will have about from 100 to 10,000 reflecting strips depending on the requirement, only a few are shown in FIG. 1 for simplicity.

In an embodiment the reflecting metal strips in the arrays, 3, 4 are replaced by reflecting grooves cut into the surface of the substrate.

To prevent a SAW velocity change through the first reflecting array the following conditions must be satisfied.

To prevent lens effects (refraction) in the first reflecting array the velocities of surface waves propagating both parallel and perpendicular (reflected) to the waves launched from the transducer should be the same irrespective of whether in primary set 6 or the secondary set 7 of reflectors. To ensure this the strips in the primary and secondary sets are arranged at equal angles about the SAW propagation direction from the input transducer (which coincides with a symmetry axis of the substrate 1).

For the array 3 of FIG. 1 the angles of the strips are at 45° to the longitudinal axis of the array 3 and direction of propagation of SAW from the input transducer 2.

In operation the input transducer 2 launches SAW towards the first array 3. Some SAW reflects off the leading strip 6 and into the second array 4 whilst other SAW pass along the first array 3 and reflect off tailing strips 6 and into the second array 4 from where SAW all reflect towards the output transducer 5. Depending upon the point of reflection within the first array the signal received at the output transducer will have a different strength or amplitude i.e. the signal will be amplitude weighted.

The spacing of the strips in the arrays 3, 4, are equal i.e. periodic, but may be of varying spacing to reflect a wide range of frequencies.

Figure 2:
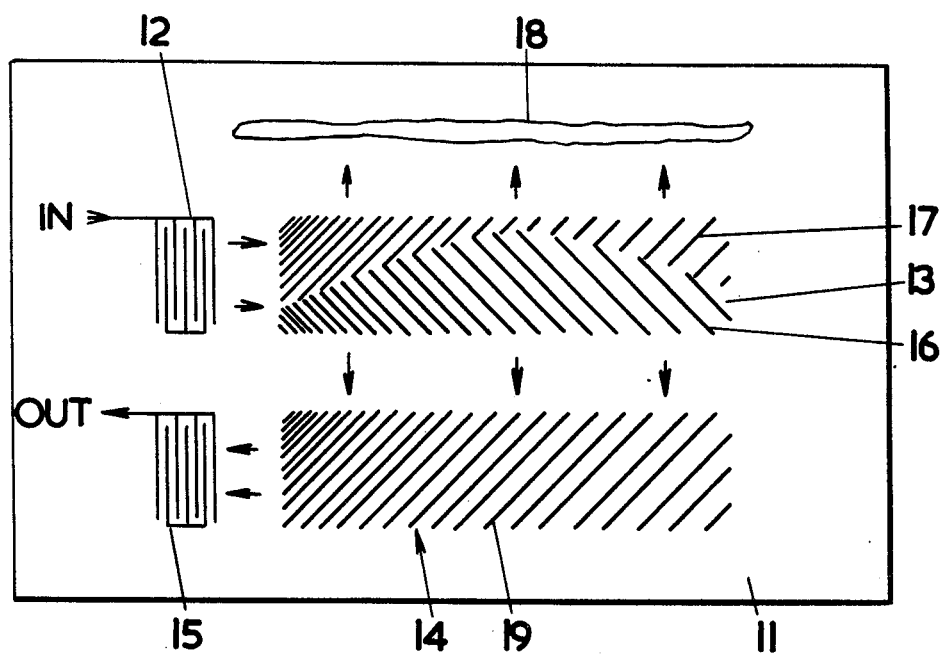
FIG. 2 shows a pulse compression device.

FIG. 2 shows a pulse expander device comprising a piezo electric substrate 11 carrying on a flat surface an input transducer 12 arranged to launch SAW into a first reflective array structure (RAST) 13 where some of the SAW are reflected into a second RAST 14 having reflecting strips 19 which itself reflects the SAW into an output transducer 15. Both transducers 12, 15 are conventional interdigital finger transducers but shown as a few finger pairs for convenience. The first RAST 13 has two sets of conducting metal strips, a primary set 16 and a secondary set 17. The primary set 16 is angled to reflect SAW into the second RAST 14 whilst the secondary set 17 is angled to reflect SAW into an absorber 18. The spacing between strips in both RAST's 13, 14 gradually increases away from the transducers 13, 14.

Since the frequency of signals reflected is inversely proportional to the inter strip spacing, higher frequencies will reflect off the strips 16 in the RAST 13 nearest the input transducer 12 whilst lower frequencies will reflect off tailing strips (i.e. those furthest away from the input transducer 12).

In operation a short pulse (i.e. a short burst of frequencies) is applied to the input transducer 12 which launches SAW into the first array 13. Some, high, SAW will reflect off the leading strips and into the second array 14 whilst other, low, SAW will pass along the first array 13 and reflect off tailing strips and into the second array 14. Thus some SAW will travel further than others and hence have a greater delay than others; as a result the output from the output transducer will be a pulse of length many times longer than the input pulse. Also the frequencies of signal at the beginning or front of the output pulse are higher than those at the end of the output pulse, i.e. the output pulse has a swept frequency. Pulse compression may be achieved by the reverse of the above, i.e. passing a weighted long pulse into the output transducer 15 and taking an output from the input transducer 12.

Figure 3A:
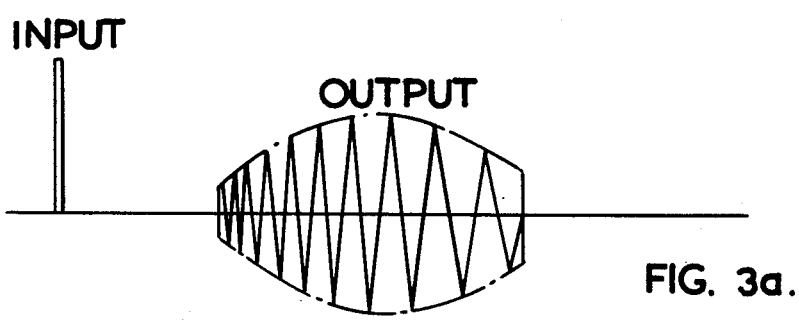
FIG. 3($a$) shows a typical frequency response curve for the device of FIG. 2.
FIG. 3(b) shows a typical frequency response curve for a device similar to FIG. 2 but without amplitude weighting.
Figure 3B:
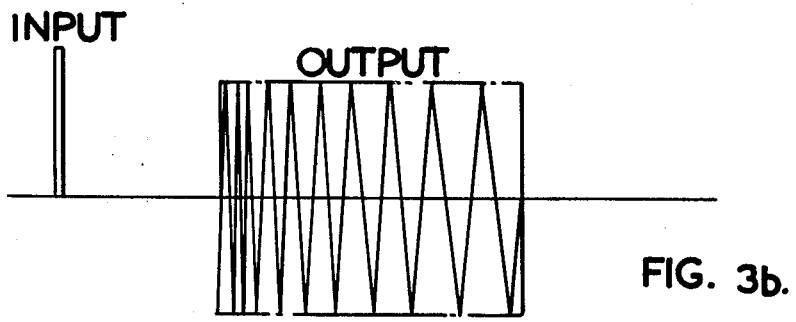

FIG. 3a shows typical output response when a short pulse is applied to the device of FIG. 2. FIG. 3b shows an output response if the first array were composed of equal length strips and it is seen that it is of box shape. Comparison of the length of strips in the primary set 16 of FIG. 2 with the output response of FIG. 3a shows identify of form (not scale). The short strips in the array 13 correspond with the small amplitude of output signal. This variation of output response is termed amplitude weighting and is desirable in radar application.

The spacing of the strips in the arrays 13, 14 has been described and shown to be of varying spacing to provide a frequency sweep within the output pulse in response to a short impulse to the device. It may also be equal to provide a single frequency output from the device.

Figure 4:
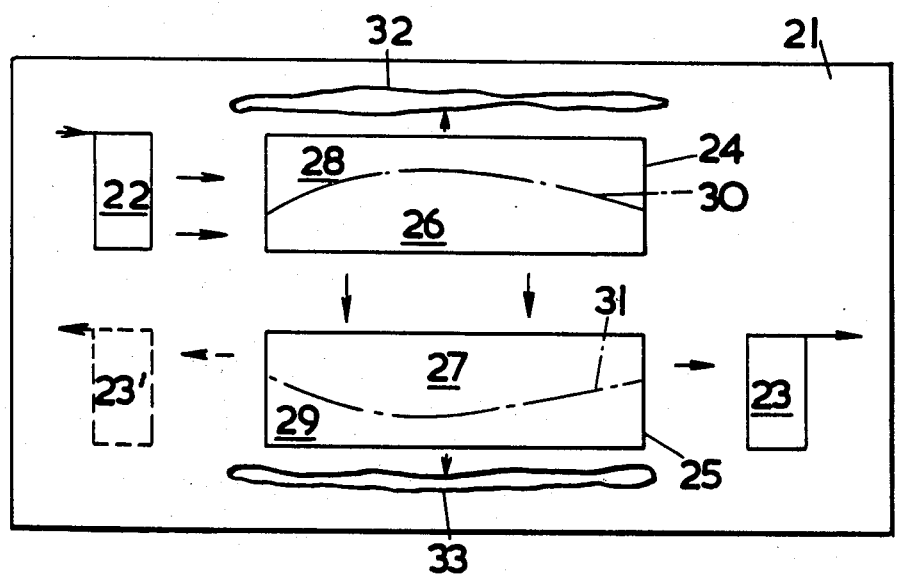
FIG. 4 shows a device with amplitude weighting shared between two reflective arrays.

FIG. 4 shows, in block diagram form a SAW device using two weighted reflective arrays (RAST). As before a piezo electric substrate 21 carried an input transducer 22 and an output transducer 23, and a first 24 and second 25 RAST both having a primary 26, 27 and a secondary 28, 29 set respectively of reflecting strips or grooves; the junction between primary and secondary strips i.e. an imaginary weighting line, is indicated by the broken lines at 30, 31. The first RAST 24 is arranged to reflect some SAW launched by the input transducer 22 into the second RAST 25 and unwanted SAW into an absorber 32. Similarly the second RAST 25 is arranged to reflect some SAW into the output transducer 23 and unwanted SAW into an absorber 33. Thus the amplitude weighting is shared by both first and second RAST: 24, 25.

In a modified construction, shown in broken line, the output transducer 23 is located beneath the input transducer 22 and the strips 27 within the second RAST 25 arranged accordingly. A pulse compression or expansion device may thus be arranged.

Figure 5:
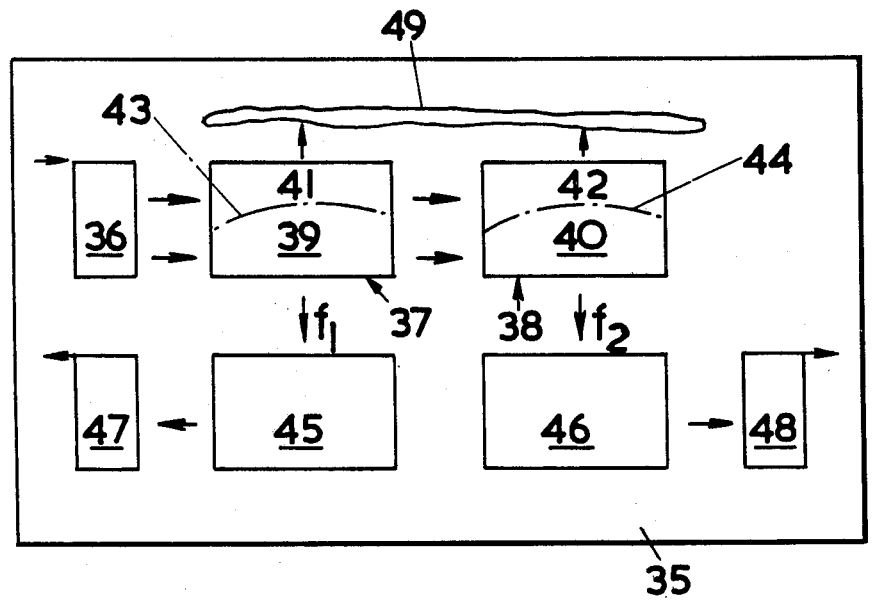
FIG. 5 shows a device with reflective arrays arranged to reflect two different frequencies into two separate tracks.

FIG. 5 shows a device for separately reflecting different frequencies. It comprises a substrate 35 with an input transducer 36 and two RAST 37, 38 arranged along one SAW track. Each RAST 37, 38 has a primary 39, 40 and a secondary set 41, 42 of reflecting strips (not shown) as in FIGS. 1, 2, the junction between the two sets being indicated by the broken lines 43, 44. The reflecting strips in the RAST 37 closest to the input transducer 36 are closer spaced than those in the other RAST 38; therefore the RAST 37 will reflect a higher frequency signal than the RAST 38. In the path of SAW reflect from the RAST's 37, 38 are two further RAST's 45, 46 similar to that indicated at 4 in FIG. 1 each arranged to reflect SAW into one of two output transducers 47, 48. The two output transducers 47, 48 will receive different frequency signals. The RAST's may be arranged so that the output transducers 47, 48 receive a single but different frequency, or a range of different frequencies by suitable spacing of reflecting strips within each RAST. The SAW reflected off the secondary set 41, 42 of reflectors in the first and second RAST 37, 38 are received by an absorber 49.

Figure 6:
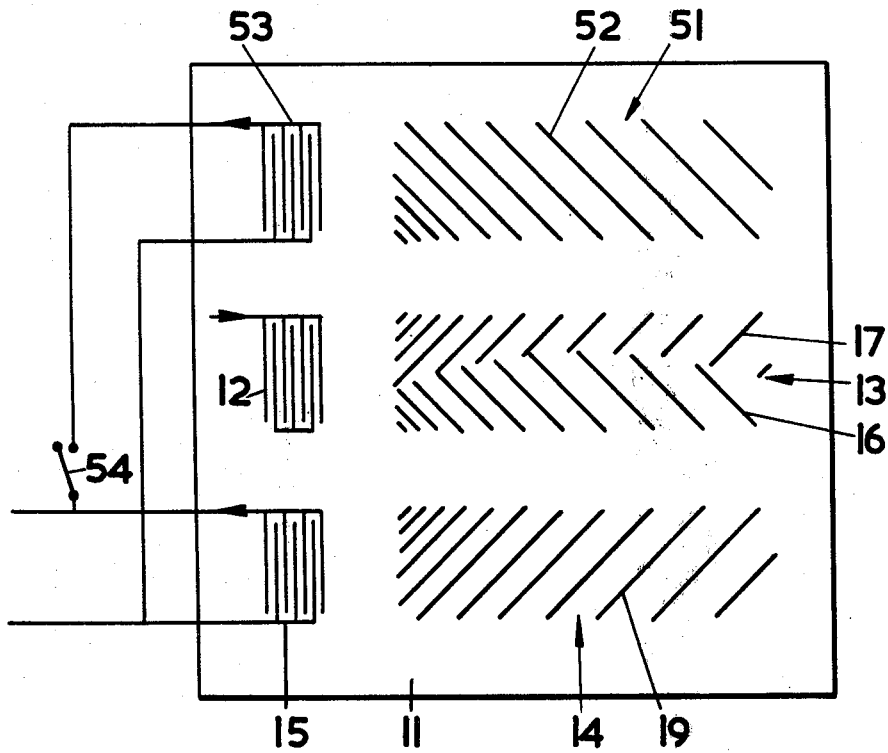
FIG. 6 shows a modified form of the device shown in FIG. 2.

FIG. 6 shows a modified form of a device shown in FIG. 2 with common components given the same numerals. It comprises a substrate 11 with an input transducer 12, which launches SAW into a first RAST 13 having a primary 16 and secondary set 17 of reflecting strips which respectively reflect the SAW through 90° into a second RAST 14 and a third RAST 51. The second RAST 14 reflects SAW into a first output transducer 15 whilst strips 52 in the third RAST 51 reflects SAW through 90° into a second output transducer 53. The two output transducers 15, 53 are connected together through a switch 54.

In operation with the switch 54 open the device operates the same as that shown in FIG. 2 with an amplitude weighted output. When the switch 54 is closed all the SAW launched by the input transducer 12 is received by the interconnected output transducers 15, 53 i.e. there is no amplitude weighting of the output signal which therefore is of a form similar to that of FIG. 3b.

Such a device as in FIG. 6 may be used to switch in and out side lobe suppression when the device is used in pulse radar. With the switch 54 open side lobes are suppressed at the expense of an increased pulse width. Closing the switch 54, and hence removing the amplitude weighting, increases side lobes but increases resolution of the main pulse. This is useful in radar systems since with suppressed side lobes in an antenna radiation pattern a target can be detected and identified within the main lobe only; the main lobe may then be narrowed to improve resolution since the consequential increase of side lobes is unimportant once it is known that no target exists within the side lobes.

In some cases it may be necessary to modify the phase of different frequencies travelling between two RAST's, e.g. to compensate for errors, imperfections, in the RAST. This may be achieved by depositing a variable width strip of material, e.g. aluminium, across a SAW track to slow, and hence alter the phase of, SAW passing under the strip; the amount of slowing being proportional to strip width.

All of the above constructions may be connected so that the input transducers become output transducers whilst the output transducers become input transducers.

I claim:

1. A surface acoustic wave device comprising a substrate able to support surface acoustic waves, a transducer for launching surface acoustic waves in a track on the substrate, a transducer for receiving surface acoustic waves from a track on the substrate, the substrate having piezo-electric regions at least at the transducers, and a first reflective array structure having two sets of varying length reflecting elements arranged across a surface acoustic wave track, one set angled to reflect some of the surface acoustic waves in the track into one direction and the other set angled to reflect some of the surface acoustic waves in the track into another direction.

2. A device according to claim 1 wherein the reflecting elements are equispaced from one another.

3. A device according to claim 1 wherein the reflecting elements are variably spaced from one another.

4. A device according to claim 1 wherein the reflecting elements are reflecting strips arranged on the substrate surface.

5. A device according to claim 1 wherein the reflecting elements are reflecting grooves arranged in the substrate surface.

6. A device according to claim 1 and further comprising a second reflective array structure having reflecting elements for reflecting surface acoustic waves received from the first array into one of the transducers.

7. A device according to claim 6 wherein the second reflective array has two sets of varying length reflecting elements one set arranged to reflect surface acoustic waves received from the first reflective array into one of the transducers and the other set angled to reflect surface acoustic waves in another direction.

8. A device according to claim 6 wherein the transducers and reflective arrays are arranged to provide expansion of an input pulse.

9. A device according to claim 6 wherein two reflecting array structures are arranged on a common track to receive surface acoustic waves from an input transducer and reflect some of these waves into two further reflective array structures which reflect some of the received waves into two output transducers.

10. A device according to claim 6 and further comprises a third reflective array for reflecting surface acoustic waves received from the second set of reflecting elements in the first array into an output transducer.

11. A surface acoustic wave device comprising a piezoelectric substrate carrying an input and output transducer, a first reflective array structure for receiving surface acoustic waves from the input transducer and reflecting them into a second reflecting array arranged to reflect the surface acoustic waves into the output transducer, each array comprising several reflecting elements spaced parallel to one another, and wherein at least one of the arrays has two sets of reflecting elements one set angled to reflect surface acoustic waves between the two arrays and the other set angled to reflect surface acoustic waves away from the arrays.

\* \* \* \* \*

UNITED STATES PATENT AND TRADEMARK OFFICE
CERTIFICATE OF CORRECTION

PATENT NO. : 3,978,437
DATED : August 31, 1976
INVENTOR(S) : Edward George Sydney Paige It is certified that error appears in the above-identified patent and that said Letters Patent are hereby corrected as shown below:

Please correct the assignee to read:

-- the Secretary of State for Defence in Her Britannic Majesty's Government of the United Kingdom of Great Britain and Northern Ireland, London, England --

Signed and Sealed this

Twenty-second Day of February 1977

[SEAL]

Attest:

RUTH C. MASON
*Attesting Officer*

C. MARSHALL DANN
*Commissioner of Patents and Trademarks*